United States Patent [19]

Takemura et al.

[11] Patent Number: 5,691,396
[45] Date of Patent: Nov. 25, 1997

[54] POLYSILOXANE COMPOUNDS AND POSITIVE RESIST COMPOSITIONS

[75] Inventors: Katsuya Takemura; Junji Tsuchiya; Osamu Watanabe; Toshinobu Ishihara, all of Nakakubiki-gun, Japan

[73] Assignee: Shin-Etsu Chemical Co., Ltd., Tokyo, Japan

[21] Appl. No.: 719,011

[22] Filed: Sep. 24, 1996

[30] Foreign Application Priority Data

Sep. 25, 1995 [JP] Japan .................... 7-270580

[51] Int. Cl.$^6$ ....................................... C08J 3/28
[52] U.S. Cl. ............................. 522/62; 522/63; 522/65; 522/15; 522/148; 522/172; 528/21; 528/25; 528/34; 528/42; 528/43
[58] Field of Search ................... 528/34, 21, 25, 528/42, 43; 522/15, 148, 172, 62, 63, 65

[56] References Cited

U.S. PATENT DOCUMENTS 5,338,818  8/1994  Brunsvold et al. ............... 430/270.1
5,350,485  9/1994  Shiraishi et al. ................... 430/323

*Primary Examiner*—Melvyn I. Marquis
*Attorney, Agent, or Firm*—Millen, White, Zelano, & Branigan, P.C.

[57] ABSTRACT

The invention provides a novel polysiloxane compound, typically polyhydroxybenzylsilsesquioxane, having some hydroxyl groups replaced by acetal groups and optionally acid labile groups. The polysiloxane compound is useful as an alkali soluble polymer for positive resist material.

20 Claims, No Drawings

POLYSILOXANE COMPOUNDS AND POSITIVE RESIST COMPOSITIONS

BACKGROUND OF THE INVENTION

1. Field of the Invention

This invention relates to a polysiloxane compound useful as a base polymer of a positive resist composition which is applicable to a two-layer resist technique and suitable for use in a fine patterning process. It also relates to a positive resist composition which is highly sensitive to actinic radiation such as deep-ultraviolet radiation, electron beam and X-ray, developable with alkaline aqueous solution to form a pattern, and thus suitable for use in a fine patterning process.

2. Prior Art

As the LSI technology tends toward higher integration and higher speed, further refinement of pattern rules is required. The current patterning technology mostly relies on light exposure which is now approaching to the essential limit of resolution which is dictated by the wavelength of a light source. It is generally recognized that in light exposure using g-line (wavelength 436 nm) or i-line (wavelength 365 nm) as a light source, a pattern rule of about 0.5 µm is the limit. For LSIs fabricated by such light exposure technique, a degree of integration equivalent to 16 mega-bit DRAM is the limit. At present, LSIs fabricated in the laboratory have reached this stage. It is urgently required to develop a finer patterning technique.

Since Ito et al. proposed a chemically amplified positive resist composition comprising a polyhydroxystyrene resin whose hydroxyl group is protected with a tert-butoxycarbonyl (t-BOC) group, which is known as PBOCST, and an onium salt photoacid generator, a variety of high sensitivity, high resolution resist materials have been developed.

Although chemically amplified resist materials are known to have high sensitivity and high resolution, it was difficult to form a fine pattern having a high aspect ratio because of the mechanical strength thereof.

Many reports have been made about chemically amplified positive resist materials using polyhydroxystyrene as a base resin and being sensitive to deep-UV, electron beam, and X-ray. All of them are single-layer resists. There still remain unsolved problems associated with substrate steps, optical reflection at the substrate, and difficulty to form high-aspect ratio patterns. These resist materials are unacceptable in practice.

The two-layer resist technique is recommended in order to form high-aspect ratio patterns on stepped substrates. To enable alkali development in the two-layer resist technique, silicone polymers having a hydrophilic group such as hydroxyl and carboxyl groups are required. Since the silicones having a hydroxyl group directly attached thereto, however, undergo crosslinking reaction in the presence of acid, it is difficult to apply such silanols to chemically amplified positive resist materials.

While polyhydroxybenzylsilsesquioxane is known as a stable alkali-soluble silicone polymer, its derivatives obtained by protecting some phenolic hydroxyl groups with t-BOC form chemically amplified silicone system positive resist materials when combined with photoacid generators as disclosed in Japanese Patent Application Kokai (JP-A) No. 118651/1994 and SPIE, Vol. 1952 (1993), 377.

However, resist materials based on a silicone polymer in the form of polyhydroxybenzylsilsesquioxane having some hydroxyl groups protected with t-BOC groups are inadequate for fine patterning since a footing phenomenon occurs at the interface with the underlying film and a substantially insoluble surface layer is likely to form in the overlying silicone resist film. The footing phenomenon and the substantially insoluble surface layer make it impossible to control the dimensional precision of a pattern to be defined in the resist film.

SUMMARY OF THE INVENTION

Therefore, an object of the present invention is to provide a polysiloxane compound which is useful as a base polymer of a chemically amplified, silicone base, positive working resist composition in the two-layer resist system in that a footing phenomenon hardly occurs at the interface with the underlying film and a substantially insoluble surface layer hardly forms in the silicone resist film.

Another object of the present invention is to provide a positive resist composition comprising the polysiloxane compound.

We have found that a novel polysiloxane compound of the following general formula (I) is obtainable by a method to be described later. Where this polysiloxane compound is used as a base polymer in a positive resist composition, a footing phenomenon does not occur at the interface between the silicone resist and the underlying film and a substantially insoluble surface layer does not form in the resist film.

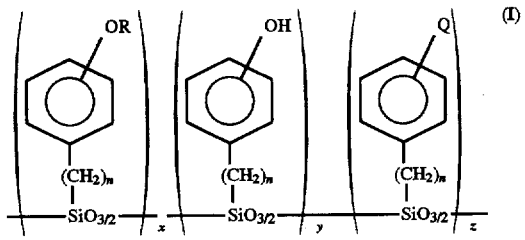

In formula ( I ),

R is

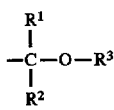

or

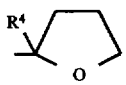

wherein each of $R^1$ and $R^2$ is a hydrogen atom or a normal or branched alkyl group having 1 to 6 carbon atoms, $R^3$ is a normal or branched alkyl group having 1 to 6 carbon atoms, $R^4$ is a hydrogen atom or methyl group, Q is an acid labile group, letters x, y, and z are numbers satisfying $x+y+z=1$, x and y are not equal to 0, and n is an integer of 1 to 3.

In general, in order that a polysiloxane be used as a positive resist material, the polysiloxane skeleton must be alkali soluble and the alkali-soluble functional group be protected with a protective group which is labile to acid. One exemplary alkali-soluble polysiloxane in abundant supply is poly(p-hydroxybenzylsilsesquioxane) consisting of units represented by the following formula (II).

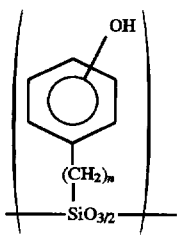

On the other hand, a t-BOC group is typical of the acid-labile protective group for protecting an alkali-soluble functional group, that is, a hydroxyl group. From these points of view, one exemplary polysiloxane compound used in positive resist material is a polysiloxane of the following formula (III) as shown in JP-A 118651/1994.

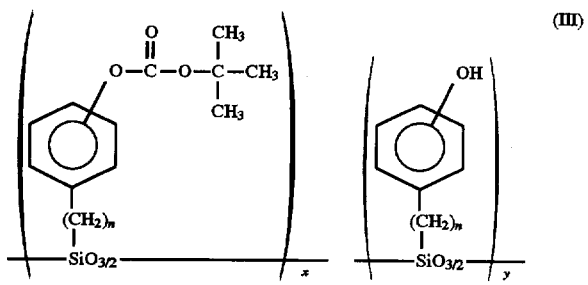

The t-BOC group used as the protective group is coupled off by the action of an acid resulting from the photoacid generator upon exposure to actinic radiation whereupon the polysiloxane becomes alkali soluble and hence, developable.

Under these circumstances, we made extensive investigations for the purposes of solving the footing phenomenon occurring at the interface between the silicone resist material and the underlying film used in two-layer resist technology and a substantially insoluble surface layer forming in the resist film. It was found through FT-IR analysis that side reaction as shown below occurs in the coupling-off reaction or acidolysis of t-BOC group in the resist film. This side reaction causes footing and formation of a substantially insoluble surface layer.

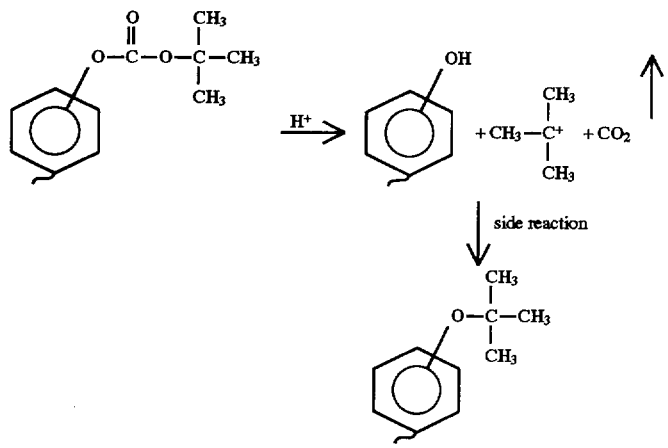

More particularly, a tert-butyl cation resulting from acidolysis of t-BOC group reacts with a phenolic hydroxyl group again, whereby the phenolic hydroxyl group is protected again and desired alkali solubility is inhibited. Then footing occurs at the interface with the underlying layer and a substantially insoluble layer develops at the film surface.

The t-BOC group requires a very large amount of activating energy for acidolysis among various protective groups for a hydroxyl group and it is one of protective groups which are difficult to couple off. Then strong acids such as trifluoromethanesulfonic acid is necessary for the coupling-off of the t-BOC group. If a weaker acid other than trifluoromethanesulfonic acid is used, it cannot promote the progress of acidolysis. Then the resist becomes less sensitive.

In the resist film, trifluoromethanesulfonic acid generated for coupling-off of t-BOC group from the protective group will diffuse into the underlying film or be deactivated by contamination from the underlying film. Since the acid concentration then lowers at the interface with the underlying layer, protective group removal reaction does not fully take place thereat and some areas are locally left alkali insoluble, giving rise to a footing phenomenon. At the resist film surface, on the other hand, trifluoromethane-sulfonic acid will evaporate off or be deactivated by contamination from the ambient air. Since the acid concentration then lowers at the surface too, protective group removal reaction does not fully take place thereat and some areas are locally left alkali insoluble, forming a substantially insoluble surface layer.

Seeking for a polysiloxane which does not undergo re-coupling reaction as does the polysiloxane having a t-BOC group and which is efficient in coupling-off reaction or acidolysis, we have found that a polysiloxane compound of general formula (I) is an effective alkali-soluble polymer.

Therefore, the present invention in a first aspect provides a polysiloxane compound of formula (I). In a second aspect, the present invention provides a positive resist composition comprising a polysiloxane compound of formula (I). Advantageously, the polysiloxane compound of formula (I) is used in combination with a photoacid generator which will decompose to generate an acid upon exposure to radiation. A dissolution inhibitor is optionally added to the resist composition.

DETAILED DESCRIPTION OF THE INVENTION

In the first aspect of the present invention, there is provided a novel polysiloxane compound of the following formula (I).

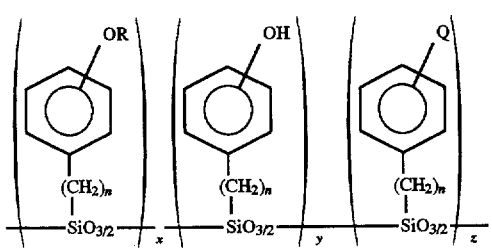  (I)

In the formula, R is (i)

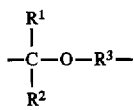

or (ii)

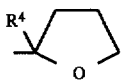

wherein each of $R^1$ and $R^2$ is a hydrogen atom or a normal or branched alkyl group having 1 to 6 carbon atoms, $R^3$ is a normal or branched alkyl group having 1 to 6 carbon atoms, $R^4$ is a hydrogen atom or methyl group. Q is an acid labile group. Letters x, y, and z are numbers satisfying x+y+z=1, x and y are not equal to 0, and n is an integer of 1, 2 or 3.

The groups (i) and (ii) are protective groups generally known as acetal groups. Especially the group (ii) is a protective group generally known as a cyclic acetal group. These protective groups can be readily coupled off since they require a significantly less amount of activation energy for acidolysis than the t-BOC group. Since these protective groups can be readily coupled off, a weak acid can be chosen for acidolysis. Alternatively, a choice can also be made among acids which are unlikely to diffuse or evaporate off and acids which withstand deactivation by contamination. As opposed to the t-BOC group, the acetal group is less likely to undergo re-coupling reaction after acidolysis, overcoming the problems of footing at the interface with the underlying layer and formation of a substantially insoluble layer at the film surface.

Preferred examples of group (i) are given below.

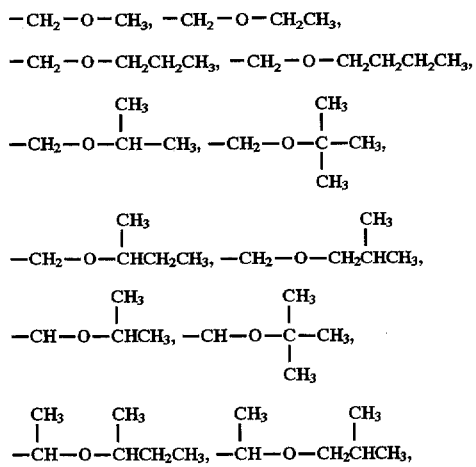

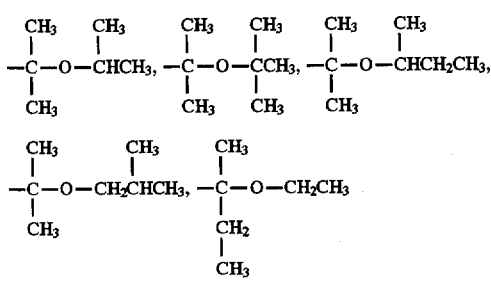

Preferred examples of cyclic acetal group (ii) are given below.

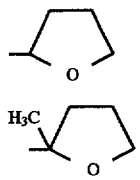

It is noted that the alkyl groups represented by $R^1$, $R^2$, and $R^3$ include methyl, ethyl, n-propyl, isopropyl, n-butyl, isobutyl, sec-butyl, and tert-butyl groups.

Q is an acid labile group, for example, tert-butylcarbonyl, tert-butylcarbonylmethyl, tert-butyl, trimethylsilyl, and tetrahydropyranyl groups.

Letters x, y, and z are numbers satisfying x>0, y>0, z≧0, and x+y+z=1. The preferred range of x is $0.05 \leq x \leq 0.8$, more preferably $0.1 \leq x \leq 0.5$. Substantial film thinning would occur with x<0.05 whereas resolution would be low with x>0.8. The preferred range of z is $0<z \leq 0.5$. With z>0.5, there is a likelihood of formation of a substantially insoluble surface layer or footing at the interface with the underlying resist layer.

The polysiloxane compound of formula (I) preferably has a weight average molecular weight (Mw) of 5,000 to 50,000, more preferably 5,000 to 10,000. With Mw<5,000, reaction control would be too difficult to produce a desired polymer. Polymers with Mw>50,000 would be insoluble in common solvents.

A polysiloxane compound of formula (I) wherein n=1 and z=0, that is, polysiloxane (Ia) shown below can be prepared by the following procedure.

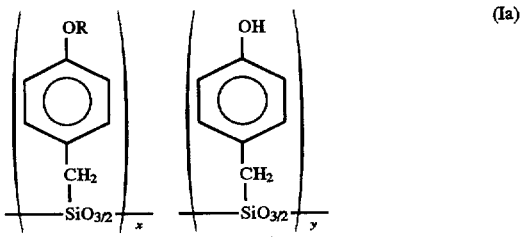  (Ia)

As shown by the following reaction scheme, first p-methoxybenzylchlorosilane is subject to hydrolysis. The hydrolysis condensate is then subject to thermal condensation to form a polysiloxane (A). The polysiloxane (A) is reacted with trimethylsilyl iodide for trimethylsilylating the methyl groups which have been used for the protection of a silanol group at the end of its backbone and a phenolic hydroxyl group. This trimethylsilylation may be carried out by dissolving polysiloxane (A) in an organic solvent such as acetonitrile, adding dropwise trimethylsilyl iodide to the solution, and allowing reaction to take place at a temperature of about 20° to 30° C. for about 8 to 10 hours.

The product is then subject to hydrolysis for coupling off the trimethylsilyl group which has protected the phenolic hydroxyl group, thereby forming a phenolic hydroxyl group. There is obtained poly(p-hydroxybenzyl)silsesquioxane. Hydrolysis of this stage Can be carried out under well-known conditions for desilylation. For example, poly(p-hydroxybenzyl)silsesquioxane can be obtained by carefully adding water so as to avoid excessive heat release while the reactor is cooled with a water jacket to maintain a temperature of 30° to 45° C.

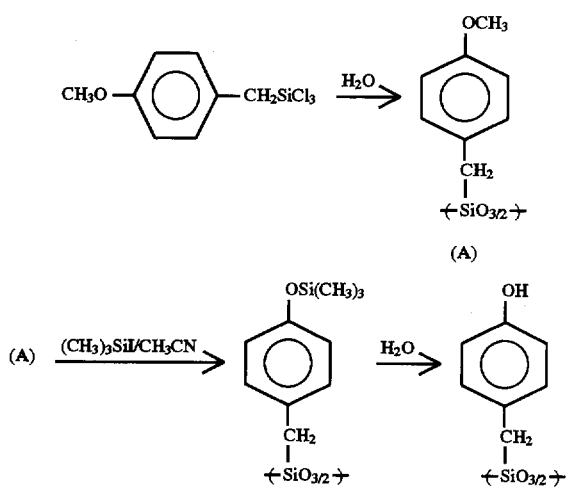

Next, some phenolic hydroxyl groups of the poly(p-hydroxybenzyl)silsesquioxane are protected by converting into acetal groups. An acetal group (i): —$CR^1R^2OR^3$ wherein both $R^1$ and $R^2$ are hydrogen atoms can be introduced by reacting with a chloromethyl ether such as Cl—$CH_2$—O—$R^3$ in the presence of a base. The base used herein is preferably one which does not scissor the siloxane bond, for example, $Na_2CO_3$.

An acetal group (i): —$CR^1R^2OR^3$ wherein $R^1$ and $R^2$ are alkyl groups or a cyclic acetal group (ii) can be introduced by reacting with a corresponding vinyl ether in the presence of an acidic catalyst such as p-toluenesulfonic acid and pyridinium p-toluenesulfonate. Examples of the vinyl ether which can be used herein are given below.

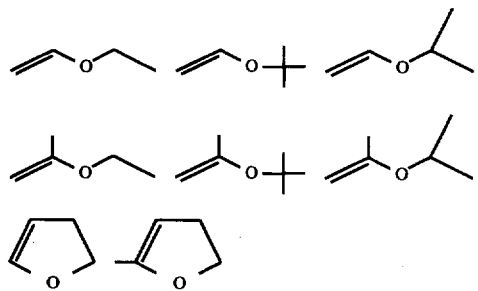

Polysiloxane compounds of formula (I) wherein n=2 or 3 and z=0 can be similarly prepared using corresponding chlorosilanes.

It is noted that x in formula (I) which represents a percent acetal introduction can be readily adjusted in terms of the amount of chloromethyl ether or vinyl ether added for reaction.

Where acid labile groups are introduced into some phenolic hydroxyl groups of the poly(p-hydroxybenzyl)-silsesquioxane, reaction is done as follows. When it is desired to introduce a tert-butoxycarbonyl group, reaction with di-tert-butyl dicarbonate is carried out in a pyridine solution. When it is desired to introduce a tert-butoxycarbonyl methyl group, reaction with tert-butyl bromoacetate is carried out in the presence of a base such as potassium carbonate. The introduction of acid labile groups can be carried out either before or after the acetal introduction.

When it is desired to introduce a tert-butyl group, reaction with tert-butyl alcohol is carried out in the presence of trifluoroacetic anhydride. In the case of trimethylsilylation, reaction with trimethylsilyl chloride is carried out in the presence of a base. Since these reaction systems can be turned acidic so that acetal groups might be coupled off during reaction, these reactions should preferably be carried out before the acetal introduction. In the case of trimethylsilylation, hexamethyldisilazane is preferably used because post-treatment becomes simple.

When it is desired to introduce a tetrahydroxypyranyl group, dihydropyrane is reacted at the same time as a vinyl ether is reacted for acetal introduction as mentioned above.

In the second aspect, the positive resist composition of the invention uses a polysiloxane compound or polysilsesquioxane of formula (I) as an alkali soluble polymer and is formulated as a two component system further comprising a photoacid generator or a three component system further comprising a photoacid generator and a dissolution inhibitor. In either case, the resist composition is developable with alkaline aqueous solution.

The amount of the polysiloxane compound of formula (I) blended is preferably at least 55% by weight, more preferably at least 80% by weight based on the total amount of components regardless of whether the composition is a two or three component system. Resist compositions containing less than 55% by weight of the polysiloxane compound of formula (I) would be less effective to apply and form resist coatings of low strength.

In the resist composition of the invention, there may be blended a photoacid generator which will decompose to generate an acid upon exposure to actinic radiation such as deep-UV radiation, electron beam and X-ray. Exemplary photoacid generators include oxime sulfonic acid derivatives, 2,6-dinitrobenzylsulfonic acid derivatives, naphthoquinone-4-sulfonic acid derivatives, 2,4-bistrichloromethyl-6-aryl-1,3,5-triazine derivatives, and α,α'-bisarylsulfonyl-diazomethanes. These photoacid generators, however, sometimes fail to provide resist compositions with high sensitivity. In this regard, useful acid generators are onium salts of the following general formula (IV):

$$(R')_p JM \qquad (IV)$$

wherein R' is independently selected from substituted or unsubstituted aromatic groups, J is sulfonium or iodonium, M is a substituted or unsubstituted alkyl or arylsulfonate group, and letter p is equal to 2 or 3.

Typical examples of the onium salt are given below.
$(C_6H_5)_2I^+{}^-O_3SCF_3$
$(C_6H_5)_2S^+{}^-O_3SCF_3$
$(C_6H_5SC_6H_4)(C_6H_5)_2)S^+{}^-O_3SCF_3$
$(C_6H_5)_2I^+{}^-O_3S\phi CH_3$
$(t\text{-Butyl-}C_6H_4)_2I^+{}^-O_3SCF_3$
$(C_6H_5(MeOC_6H_5)I^+{}^-O_3S\phi CH_3$ It is noted that φ is $C_6H_4$.

However, resist materials containing these photoacid generators are sometimes less useful since the generators have the following drawbacks. First, some onium salt photoacid generators are less soluble in solvents suitable for coating of resist materials, for example, ethylcellosolve acetate, ethyl lactate and ethoxy-2-propanol. It is then difficult to blend an appropriate amount of the photoacid generator in a resist material. Some other onium salt photoacid generators are soluble in solvents, but more or less incompatible with polysiloxane compounds. It is then difficult to form acceptable resist films. Such resist films are prone to changes with time of sensitivity and a pattern shape during a period from light exposure to heat treatment. Especially in the case of incompatible photoacid generators, the resist film can have a distribution profile of photoacid generator, resulting in overhangs at the pattern surface. Such a phenomenon often occur in chemically amplified resist materials since the acid is deactivated at the resist film surface or the surface is depleted of the photoacid generator.

Therefore, more preferred photoacid generators are onium salts of formula (IV) wherein at least one of the R groups is a phenyl group having a tert-alkoxy, tert-butoxycarbonyloxy or tert-butoxycarbonylmethoxy substituent. The tert-alkoxy substituent is represented by R"$_3$CO— wherein R" is a substituted or unsubstituted monovalent hydrocarbon group such as an alkyl group having 1 to 10 carbon atoms and aryl group. These onium salts are well soluble in commonly used resist solvents and well compatible with polysiloxane compounds and lead to an improvement in solubility after exposure so that a pattern having side walls perpendicular to the substrate may be defined. The onium salts of formula (IV) wherein at least one of the R' groups is a tert-alkoxyphenyl, tert-butoxycarbonyloxyphenyl or tert-butoxycarbonylmethoxyphenyl group lead to an improved solubility after exposure since a phenolic hydroxyl group or carboxylic acid is generated upon exposure and heat treatment. While most onium salts generally act to inhibit dissolution, the preferred onium salts defined herein act to promote dissolution after exposure. Then these onium salts are used with the advantage of an increased difference in dissolution rate before and after exposure. Solubility increases as more R groups are replaced by tert-alkoxy, tert-butoxycarbonyloxy or tert-butoxycarbonylmethoxy groups.

Given below are examples of the onium salt of formula (IV) wherein at least one of the R' groups is replaced by a tert-alkoxy, tert-butoxycarbonyloxy or tert-butoxycarbonylmethoxy.

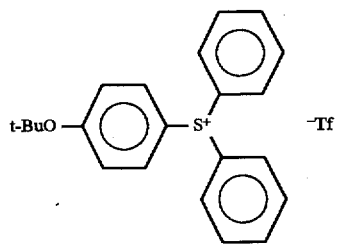

-continued

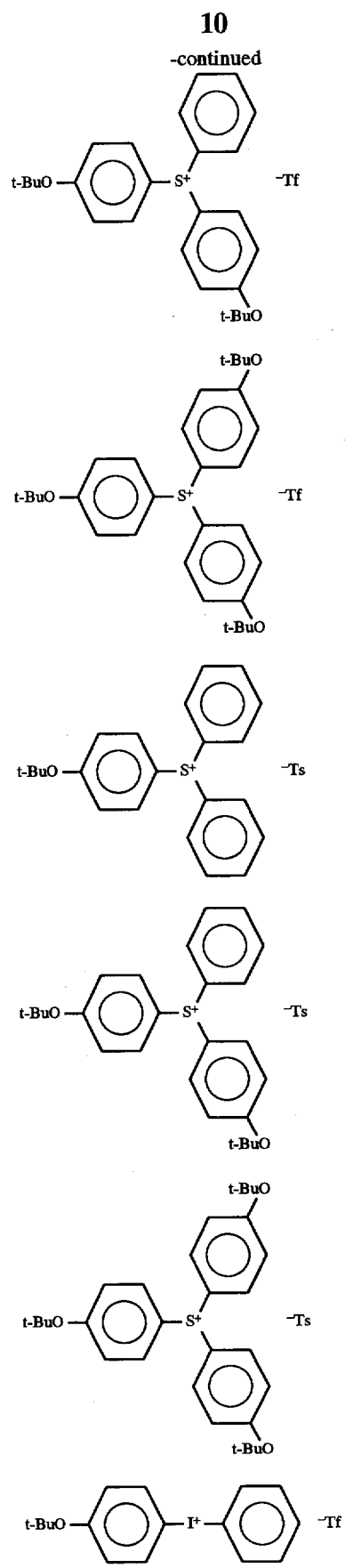

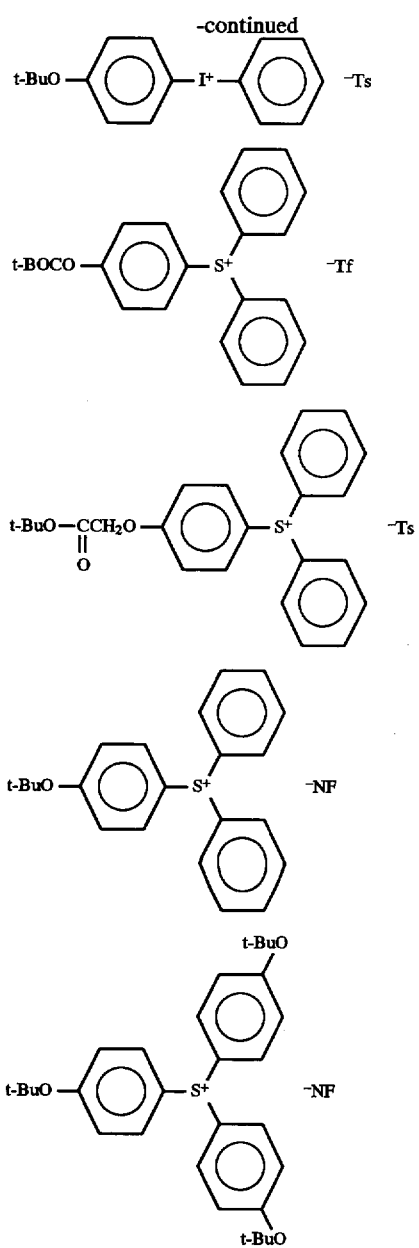

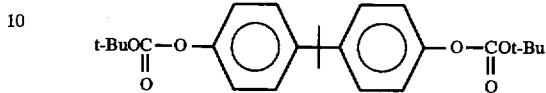

In the formulae, Tf is p-trifluoromethanesulfonate and Ts is p-toluenesulfonate, t-BOC is a tert-butoxycarbonyl group, and NF is nonafluorobutanesulfonate.

Preferably the photoacid generator is contained in an amount of 0.5 to 15% by weight, especially 1 to 10% by weight of the entire composition. A composition containing less than 0.5% of the photoacid generator exhibits positive resist performance, but is less sensitive. The resist increases its sensitivity and contrast ( y ) as the amount of the photoacid generator increases. A composition containing more than 15% of the photoacid generator exhibits positive resist performance. However, since no further improvement in sensitivity is expected from excessive contents, the onium salt is an expensive reagent, and an increased content of a low molecular weight component in the resist reduces the mechanical strength and oxygen plasma resistance of a resist film, the onium salt content should preferably be 15% or less.

The positive resist composition according to the invention is used not only as a two component system comprising a polysiloxane compound of formula (I) and a photoacid generator, but also as a three component system further comprising a dissolution inhibitor.

The dissolution inhibitor used herein may be any of dissolution inhibitors used in conventional three-component resist compositions, for example, bisphenol A derivatives wherein OH groups are converted into t-BOC groups as shown by the following formula:

and fluoroglucine and tetrahydroxybenzophenone having t-BOC groups incorporated therein.

Preferably the dissolution inhibitor is contained in an amount of up to 40% by weight, especially 10 to 30%. by weight of the entire composition. More than 40% of the dissolution inhibitor would significantly detract from oxygen plasma resistance and restrain use as a two-layer resist.

In a preferred embodiment of the invention, a nitrogenous compound is added to the positive resist composition. The nitrogenous compounds used herein include those compounds which are liquid at room temperature, for example, N-methylaniline, toluidine and N-methylpyrrolidone, and those compounds which are solid at room temperature, for example, aminobenzoic acid and phenylenediamine. Since most liquid compounds have a low boiling point and evaporate off during pre-baking of resist films, they are not effective for the purpose. For this reason, preferred nitrogenous compounds are o-aminobenzoic acid, m-aminobenzoic acid, p-aminobenzoic acid, o-phenylenediamine, m-phenylenediamine, p-phenylenediamine, and diphenylamine. Preferably the nitrogenous compound is contained in an amount of 0.01 to 1% by weight, especially 0.1 to 0.5% by weight of the entire composition. Less than 0.01% of the nitrogenous compound would be ineffective whereas more than 1% of the nitrogenous compound would cause a significant drop of sensitivity.

The resist composition of the invention is prepared by dissolving the polysiloxane compound of formula (I) and if desired, a photoacid generator, nitrogenous compound, dissolution inhibitor, and other optional components in an organic solvent. Use may be made of organic solvents in which these components are soluble and which allow for uniform spreading of a resist film. Examples include butyl acetate, xylene, acetone, cellosolve acetate, ethylene glycol monomethyl ether, diethylene glycol monomethyl ether, ethylene glycol monoethyl ether, diethylene glycol dibutyl ether, diethylene glycol dimethyl ether, ethyl lactate, methyl lactate, propyl lactate, and butyl lactate. These organic solvents may be used alone or in admixture. The amount of the organic solvent used is several times the total amount of the resist components.

If desired, a surface-active agent and other suitable additives may be blended in the resist compositions of the invention.

A resist pattern is formed from the resist composition of the invention, for example, by the following procedure. A resist solution formulated according to the invention is spin coated onto a substrate, pre-baked, and imagewise exposed to actinic radiation. At this point, the photoacid generator decomposes to generate an acid. After exposure, the resist film is baked. During this post-exposure baking (PEB), the acid catalyzes decomposition of an acid labile group so that the dissolution inhibitory effect is lost. Thereafter, the resist film is developed with an aqueous alkaline solution and rinsed with water, obtaining a positive resist pattern.

The resist material of the invention is useful as a two-layer resist since it uses a polysiloxane compound of formula (I) as the base resin and is fully resistant to oxygen plasma etching. More particularly, a relatively thick organic polymer layer is formed on a substrate as a lower resist layer before a resist solution formulated according to the invention is spin coated thereon. The upper resist film of the invention is processed as above to form a resist pattern. Thereafter, the resist layers are subject to oxygen plasma etching. The lower resist layer is selectively etched away whereby the pattern of the upper resist layer is formed in the lower resist layer.

For the lower resist layer, a novolak resin based positive resist composition may be used. After it is coated onto a substrate, it is subject to hard baking at 200° C. for one hour, thereby preventing intermixing with the overlying inventive resist composition.

There has been described a polysiloxane compound which is useful as an alkali-soluble polymer for a positive resist composition. It is especially useful as an alkali-soluble polymer for a chemically amplified silicone base positive resist composition applicable to the two-layer resist technology because it solves the problems of footing at the interface with the lower layer and formation of a substantially insoluble layer at the surface of silicone resist film.

Also the positive working resist composition of the invention is sensitive to actinic radiation, has superior sensitivity and resolution, and lends itself to fine processing technology using electron beam and deep-UV radiation. Because of very low absorption at the exposure wavelength of a KrF excimer laser, the resist composition forms a fine pattern having a wall perpendicular to the substrate. Because of the high oxygen plasma etching resistance of the resist composition of the invention, a two-layer resist having a resist film of the invention coated on a lower resist layer can be finely patterned at a high aspect ratio.

EXAMPLE

Examples of the present invention are given below by way of illustration and not by way of limitation. In the examples, the molecular weight is a weight average molecular weight (Mw).

EXAMPLE 1

Methoxymethylation of Polyhydroxybenzylsilsesquioxane

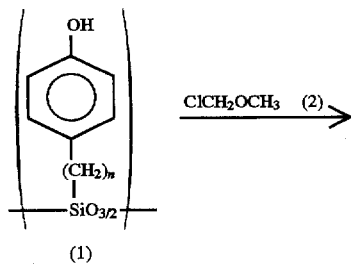

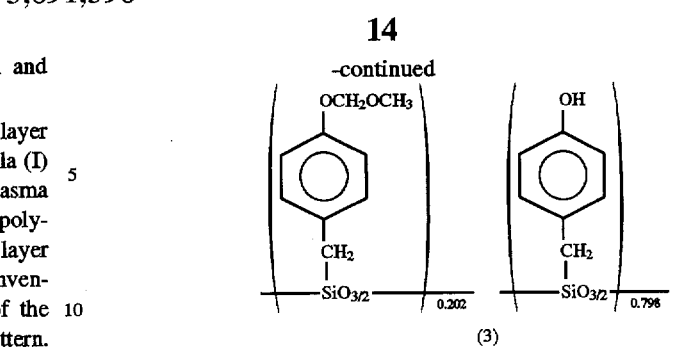

In 200 grams of chloroform was dissolved 25 grams (corresponding to 0.16 mol of hydroxylbenzyl group) of polyhydroxybenzylsilsesquioxane (1) of the units shown above having a molecular weight of 5,000. Methyl-tri-n-ocyl-ammonium chloride, 0.6 gram, as a catalyst and an aqueous solution containing 40 grams of sodium carbonate in 160 grams of water were added to the solution, followed by agitation. Then a solution containing 77 grams (0.96 mol) of chloromethyl ether (2) in 100 grams of chloroform was added to the reaction solution at room temperature over 2 hours. The reaction solution was then agitated and ripened for 6 hours at room temperature. At the end of reaction, the solution was fractionated. The reaction mixture was washed with water until the wash water became neutral. Chloroform was stripped off from the reaction solution. The residue was dissolved in 100 ml of methanol and added dropwise to 5 liters of water, yielding a white precipitate. The precipitate was washed with water 5 times, filtered, and dried in vacuum at 40° C. or less, obtaining 20 grams of methoxymethylated polyhydroxybenzylsilsesquioxane (3).

Analysis by Proton-NMR

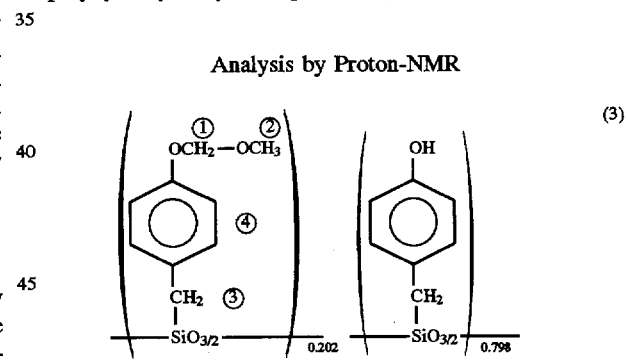

① 5.1 ppm

② 1.4 ppm

③ 1.5–2.0 ppm, broad

④ phenyl group 6–7 ppm, broad

Analysis by Gel Permeation Chromatography (GPC)

Polymer (3)'s molecular weight: 5,050 (based on polystyrene)

Percent methoxymethylation: 20.2%

EXAMPLE 2

Ethoxyethylation of Polyhydroxybenzylsilsesquioxane

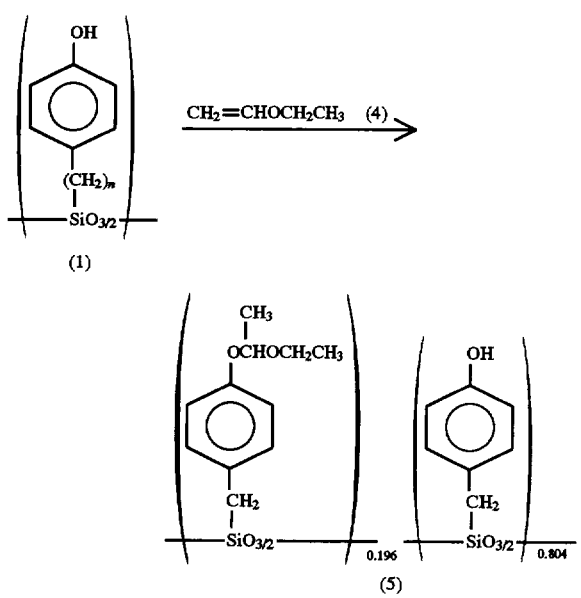

In 40 grams of acetone was dissolved 25 grams (corresponding to 0.16 mol of hydroxylbenzyl group) of polyhydroxybenzylsilsesquioxane (1) of the above units having a molecular weight of 5,000. Pyridinium tosylate, 5.6 grams, as a catalyst was added to the solution. With ice cooling, 9.2 grams (0.128 mol) of ethyl vinyl ether (4) in 30 ml of acetone was added over about two hours so that the temperature might not exceed 10° C. The ice bath was taken off and the reaction solution was then agitated and ripened for 10 hours at room temperature. At the end of reaction, acetone was stripped off from the solution. The residue was dissolved in 100 ml of methanol and added dropwise to 5 liters of water, yielding a white precipitate. The precipitate was washed with water 5 times, filtered, and dried in vacuum at 40° C. or less, obtaining 22 grams of ethoxyethylated polyhydroxybenzylsilsesquioxane (5).

Analysis by Proton-NMR

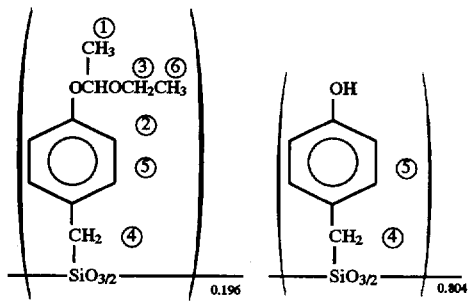

① 1.5 ppm
② 5.9 ppm, broad
③ 3.6 ppm, broad
④ 1.5–2.0 ppm, broad
⑤ phenyl group 6–7 ppm, broad
⑥ 1.2 ppm Analysis by GPC Polymer (5)'s molecular weight: 5,010 (based on polystyrene)

Percent ethoxyethylation: 19.6

EXAMPLE 3 t-butoxyethylation of Polyhydroxybenzylsilsesquioxane

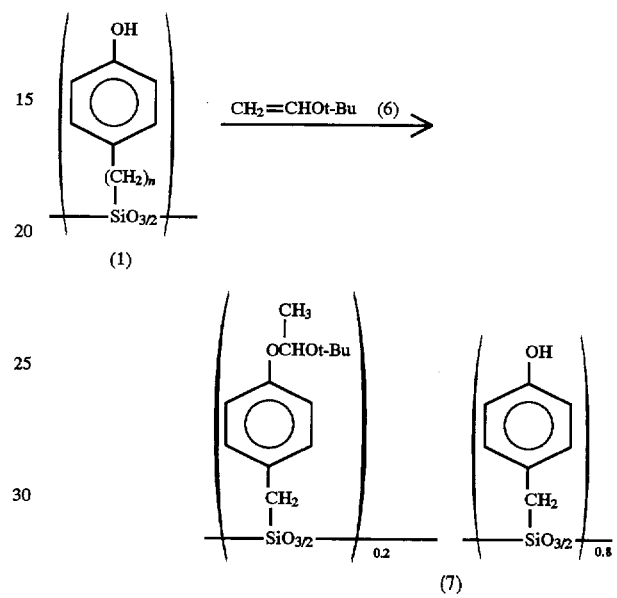

Reaction was carried out as in Example 2 except that 12.8 grams of tert-butyl vinyl ether (6) was used instead of the ethyl vinyl ether, obtaining 21 grams of tert-butoxyethylated polyhydroxybenzylsilsesquioxane (7).

Analysis by Proton-NMR

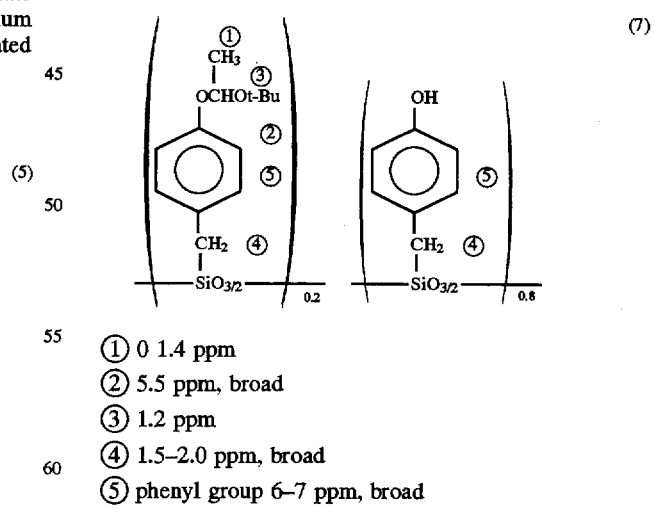

① 0 1.4 ppm
② 5.5 ppm, broad
③ 1.2 ppm
④ 1.5–2.0 ppm, broad
⑤ phenyl group 6–7 ppm, broad Analysis by GPC Polymer (7)'s molecular weight: 5,010 (based on polystyrene)

Percent tert-butoxyethylation: 20.0

EXAMPLE 4 n-butoxyethylation of Polyhydroxybenzylsilsesquioxane

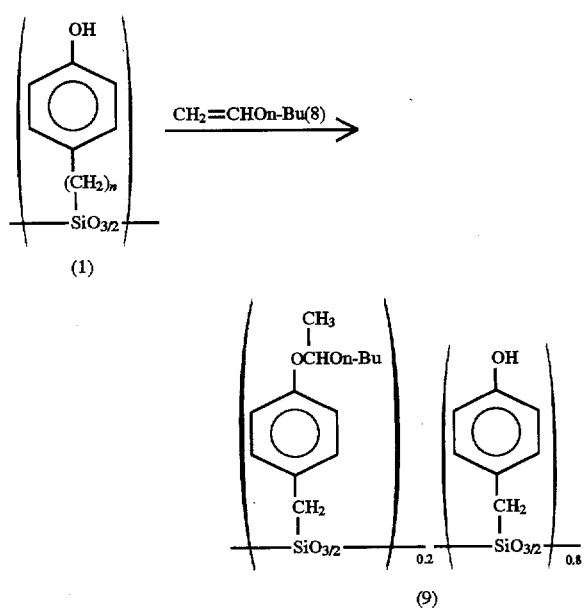

Reaction was carried out as in Example 2 except that 12.8 grams of n-butyl vinyl ether (8) was used instead of the ethyl vinyl ether, obtaining 20 grams of n-butoxyethylated polyhydroxybenzylsilsesquioxane (9).

Analysis by Proton-NMR

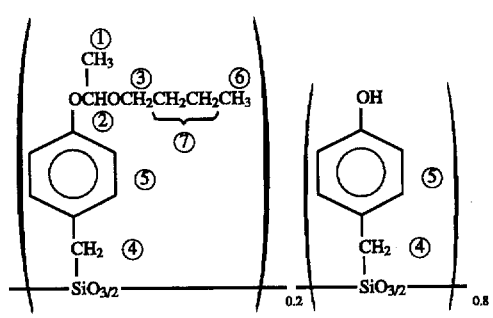

① 1.4 ppm
② 5.4 ppm, broad
③ 2.0 ppm, broad
④ 1.5–2.0 ppm, broad
⑤ phenyl group 6–7 ppm, broad
⑥ 1.0 ppm, broad
⑦ 1.3–1.6 ppm, broad Analysis by GPC Polymer (9)'s molecular weight: 5,010 (based on polystyrene)

Percent n-butoxyethylation: 20.0

EXAMPLE 5

Isobutoxyethylation of Polyhydroxybenzylsilsesquioxane

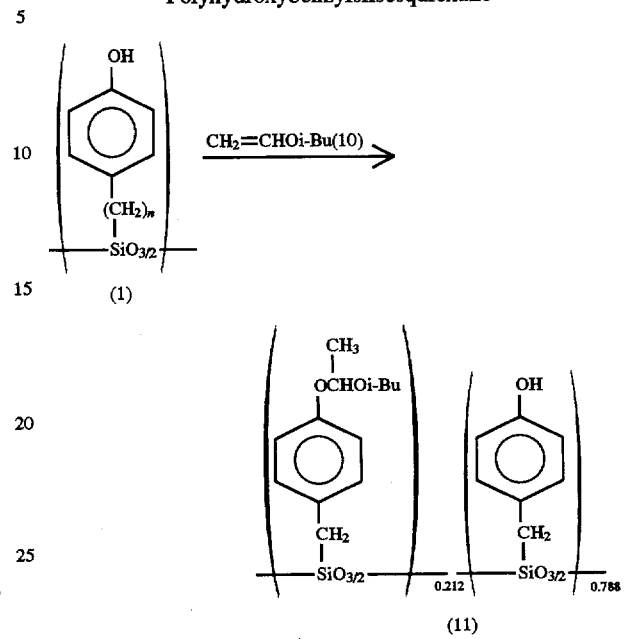

Reaction was carried out as in Example 2 except that 12.8 grams of isobutyl vinyl ether (10) was used instead of the ethyl vinyl ether, obtaining 20 grams of isobutoxyethylated polyhydroxybenzylsilsesquioxane (11).

Analysis by Proton-NMR

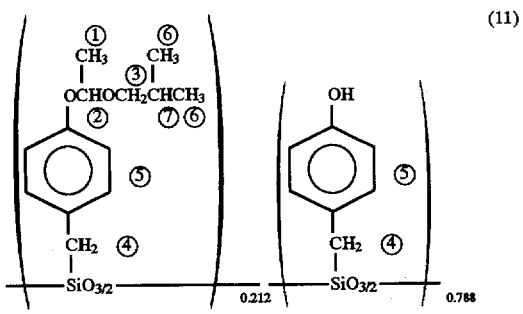

① 1.4 ppm
② 5.3 ppm, broad
③ 1.8–2.2 ppm, broad
④ 1.5–2.0 ppm, broad
⑤ phenyl group 6–7 ppm, broad
⑥ 0.9 ppm
⑦ 1.6–2.0 ppm Analysis by GPC Polymer (11)'s molecular weight: 5,010 (based on polystyrene)

Percent isobutoxyethylation: 20.0

EXAMPLE 6

Introduction of Tetrahydrofuranyl Into Polyhydroxybenzylsilsesquioxane

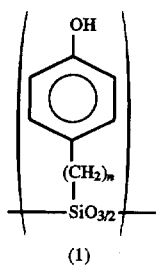
(1)

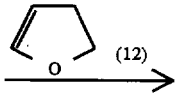

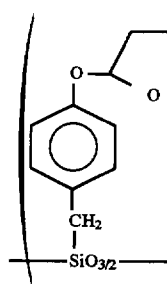
(13)

Reaction was carried out as in Example 2 except that 8.8 grams of 2,3-dihydropyran (12) was used instead of the ethyl vinyl ether, obtaining 20 grams of tetrahydrofuranyl-bearing polyhydroxybenzylsilsesquioxane (13).

Analysis by Proton-NMR

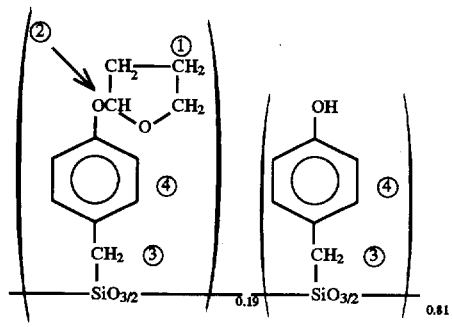
(13)

① 1.2–2 ppm, broad

② 5–6 ppm, broad

③ 1.5–2.0 ppm, broad

④ phenyl group 6–7 ppm, broad

Analysis by GPC

Polymer (13)'s molecular weight: 5,010 (based on polystyrene)

Percent tetrahydrofuranyl introduction: 19.0

EXAMPLE 7

Introduction of t-butylcarbonyl and Ethoxyethyl Into Polyhydroxybenzylsilsesquioxane

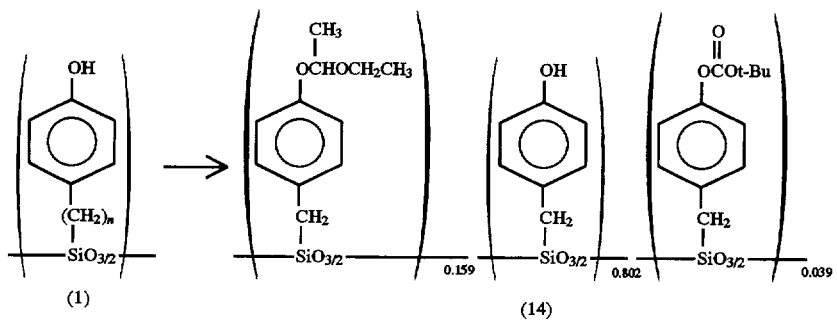
(1) → (14)

In 250 grams of pyridine was dissolved 25 grams (corresponding to 0.16 mol of hydroxylbenzyl group) of polyhydroxybenzylsilsesquioxane (1) of the above-shown units having a molecular weight of 5,000. With stirring at 45° C., 1.37 grams (0.006 mol, about 4 mol% relative to the hydroxyl group) of di-tert-butyl dicarbonate was added thereto. Gas was given off at the same time as addition. Reaction was continued for 2 hours in a nitrogen stream. Pyridine was stripped off from the reaction solution. The residue was dissolved in 100 ml of methanol and added dropwise to 5 liters of water, yielding a white precipitate. The precipitate was washed with water 5 times, filtered, and dissolved in 40 grams of acetone.

Thereafter, the product was reacted with 7.36 grams (0.010 mol) of ethyl vinyl ether as in Example 2, obtaining a polymer (14) in the form of polyhydroxybenzylsilsesquioxane having tert-butylcarbonyl and ethoxyethyl groups introduced into hydroxyl groups thereof.

Analysis by Proton-NMR

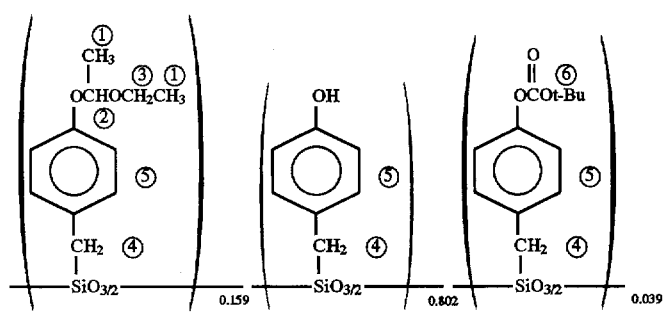

① 1.5 ppm
② 5.9 ppm
③ 3.6 ppm
④ 1.5–2.0 ppm, broad
⑤ phenyl group 6–7 ppm, broad
⑥ tert-butyl group 1.7–1.8 ppm Analysis by GPC Polymer (14)'s molecular weight: 5,030 (based on polystyrene)
Percent ethoxyethyl introduction: 15.9%
Percent tert-butylcarbonyl introduction: 3.9%

EXAMPLE 8

A resist solution was prepared from the following ingredients.

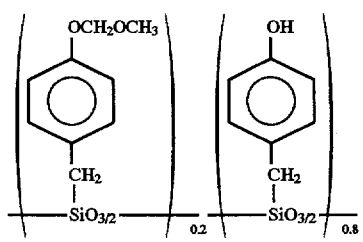

Molecular weight 5,2000

|  | pbw |
| --- | --- |
| Base resin (A) | 96 |
| Tri(p-t-butoxyphenyl)trifluoromethane sulfonate | 4 |
| 1-ethoxy-2-propanol | 600 |

It was coated onto a silicon substrate and pre-baked on a hot plate at 100° C. for one minute, obtaining a film of 0.35 μm thick. The resist film was exposed imagewise to a KrF excimer laser beam, developed with an aqueous solution of 2.38% tetramethylammonium hydroxide (TMAH) for one minute, and rinsed with water for 30 seconds.

The resist material was positive working and had an Eth sensitivity of 3.2 mJ/cm$^2$ as evaluated using a KrF excimer laser beam (wavelength 248 nm) as deep-UV radiation. The base resin used herein had a dissolution rate of 40 nm/s in the developer. The resist material had a dissolution rate of about 1.8 nm/s in unexposed areas.

Upon imagewise exposure with the KrF excimer laser beam, a 0.22 μm line-and-space pattern could be resolved and a pattern having a side wall perpendicular to the substrate was formed.

Separately, a silicon wafer was coated with a lower resist film of 2 μm thick using OFPR 800 (Tokyo Oka K.K.), and the film was cured by heating at 200° C. for 5 minutes. The resist solution prepared above was coated onto the lower resist film to a thickness of about 0.35 μm and pre-baked. The resist film was then exposed to a KrF excimer laser beam and developed, forming a pattern on the lower resist film. The pattern had a wall perpendicular to the lower resist film and no footing was observed.

Using a parallel plate type sputter etching apparatus, the resist was etched with oxygen gas as an etchant gas. The etching conditions are shown below.

Gas flow rate: 50 SCCM

Gas pressure: 1.3 Pa

RF power: 50 watts

DC bias: 450 volts

The lower resist film was etched at a rate of 150 nm/min. while the upper resist film of the inventive composition was etched at a rate of less than 3 nm/min. After 15 minutes of etching, those portions of the lower resist film which were not covered with the upper resist film were completely eliminated, leaving a two-layer resist pattern having a thickness of more than 2 μm.

EXAMPLES 9–13 AND COMPARATIVE EXAMPLE

Resist solutions were prepared in accordance with the formulation of Example 8 except that polymers (B) to (F) shown below were used instead of polymer (A). They were processed and tested as in Example 8. The sensitivity and resolution of the resist films on silicon substrates after KrF excimer laser exposure are shown in Table 1 together with the resolution of them on the lower resist film.

For comparison purposes, a resist solution was prepared in accordance with the formulation of Example 8 except that a polymer (G) shown below was used instead of polymer (A). The sensitivity and resolution of the comparative resist film on a silicon substrate after KrF excimer laser exposure are shown in Table 1 together with the resolution of it on the lower resist film.

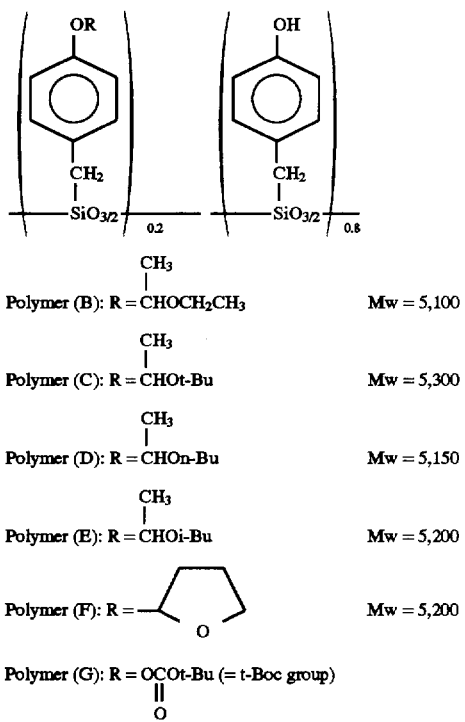

Polymer (B): R = CHOCH₂CH₃ with CH₃ branch, Mw = 5,100

Polymer (C): R = CHOt-Bu with CH₃ branch, Mw = 5,300

Polymer (D): R = CHOn-Bu with CH₃ branch, Mw = 5,150

Polymer (E): R = CHOi-Bu with CH₃ branch, Mw = 5,200

Polymer (F): R = tetrahydrofuranyl, Mw = 5,200

Polymer (G): R = OCOt-Bu (= t-Boc group)

TABLE 1

| Poly- mer | Sensitivity (mJ/cm²) | Resolution (μm) | On silicon substrate Pattern profile | on lower resist film Pattern profile |
|---|---|---|---|---|
| Example 8 | A | 3.2 | 0.22 | rectangular | rectangular, no footing |
| Example 9 | B | 3.2 | 0.22 | rectangular | rectangular, no footing |
| Example 10 | C | 2.5 | 0.22 | rectangular | rectangular, no footing |
| Example 11 | D | 3.0 | 0.22 | rectangular | rectangular, no footing |
| Example 12 | E | 3.0 | 0.22 | rectangular | rectangular, no footing |
| Example 13 | F | 4.0 | 0.22 | rectangular | rectangular, no footing |
| Comparison | G | 3.5 | 0.25 | rectangular, insoluble surface layer | rectangular, serious footing |

Japanese Patent Application No. 270580/1995 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

We claim:

1. A polysiloxane compound of the following general formula (I):

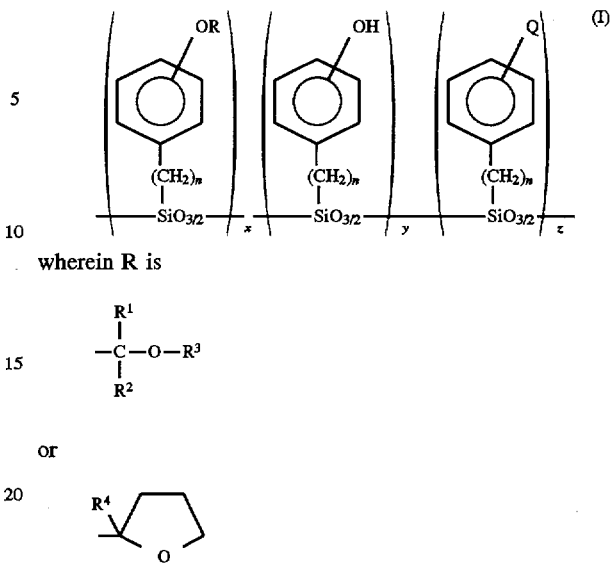

wherein R is $$-\underset{R^2}{\overset{R^1}{\underset{|}{\overset{|}{C}}}}-O-R^3$$

or

wherein each of R¹ and R² is a hydrogen atom or a normal or branched alkyl group having 1 to 6 carbon atoms, R³ is a normal or branched alkyl group having 1 to 6 carbon atoms, R⁴ is a hydrogen atom or methyl group, Q is an acid labile group, letters x, y, and z are numbers satisfying x+y+z=1, x and y are not equal to 0, and n is an integer of 1 to 3.

2. In a positive resist composition comprising a polysiloxane compound, the improvement wherein the compound is one of formula I of claim 1.

3. A positive resist composition comprising the polysiloxane compound of claim 1 and a photoacid generator which will decompose to generate an acid upon exposure to radiation, said resist composition being developable with alkaline aqueous solution.

4. The resist composition of claim 3 wherein said photoacid generator is an onium salt of the following general formula:

(R')ₚJM wherein R' is independently selected from substituted or unsubstituted aromatic groups, J is sulfonium or iodonium, M is a substituted or unsubstituted alkyl or aryl sulfonate, and letter p is equal to 2 or 3.

5. The resist composition of claim 3 further comprising a dissolution inhibitor.

6. The compound of claim 1, wherein

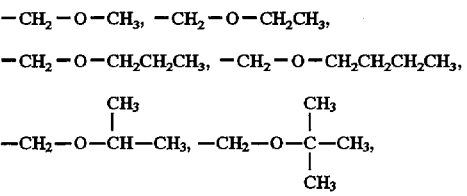

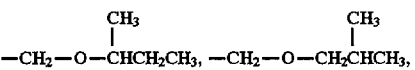

-continued

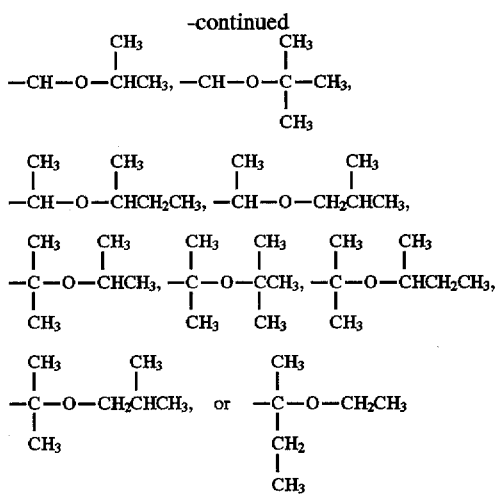

7. The compound of claim 1., wherein Q is tert-butylcarbonyl, tert-butylcarbonylmethyl, tert-butyl, trimethylsilyl, or tetrahydropyranyl.
8. The compound of claim 1, wherein x is 0.05 to 0.8.
9. The compound of claim 1, wherein x is 0.1 to 0.5.
10. The compound of claim 1, wherein $0<z\leq 0.5$.
11. The resist composition of claim 2, wherein R is

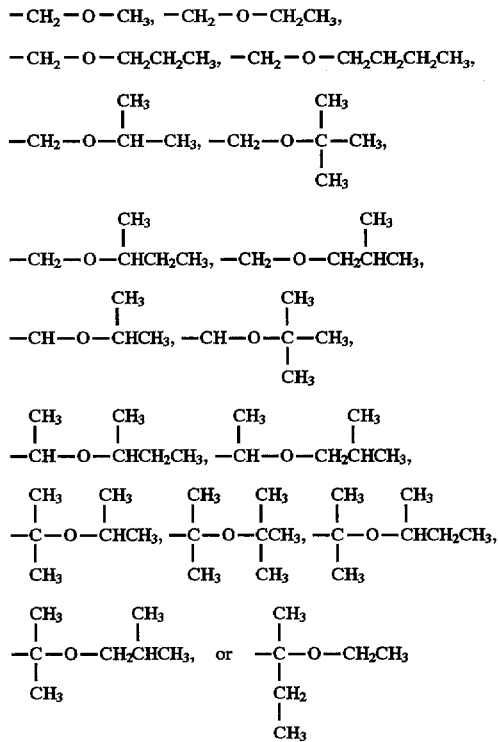

12. The resist composition of claim 2, wherein Q is tert-butylcarbonyl, tert-butylcarbonylmethyl, tert-butyl, trimethylsilyl, or tetrahydropyranyl.
13. The resist composition of claim 2, wherein x is 0.05 to 0.8.
14. The resist composition of claim 2, wherein x is 0.1 to 0.5.

15. The resist composition of claim 2, wherein $0<z\leq 0.5$.
16. The resist composition of claim 2, wherein the amount of the compound of formula I is at least 55% by weight.
17. The resist composition of claim 3, wherein the photoacid generator is oxime sulfonic acid, 2,6-dinitrobenzylsulfonic acid, naphthoquinone-4-sulfonic acid, 2,4-bistrichloromethyl-6-aryl-1,3,5-triazine or α,α'-bisarylsulfonyl-diazomethane.
18. The resist composition of claim 4, wherein the photoacid generator is $(C_6H_5)_2I^+{}^-O_3SCF_3$
$(C_6H_5)_2S^+{}^-O_3SCF_3$
$(C_6H_5SC_6H_4)(C_6H_5)_2S^+{}^-O_3SCF_3$
$(C_6H_5)_2I^+{}^-O_3S\phi CH_3$
$(t\text{-Butyl-}C_6H_4)_2I^+{}^-O_3SCF_3$ or
$(C_6H_5)(MeOC_6H_4)I^+{}^-O_3S\phi CH_3$ in which $\phi$ is $C_6H_4$.

19. The resist composition of claim 4, wherein R' is a phenyl group having a tert-alkoxy, tert-butyoxycarbonyloxy or tert-butoxycarbonylmethoxy substituent.

20. A process for the preparation of a resist composition of claim 2, comprising combining a compound of the formula (I):

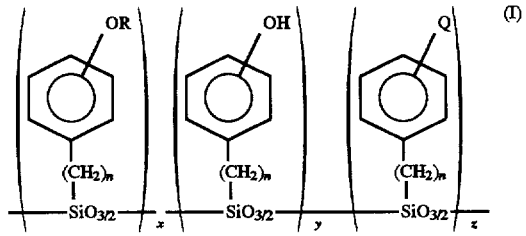

wherein R is

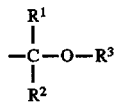

or

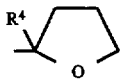

wherein each of $R^1$ and $R^2$ is a hydrogen atom or a normal or branched alkyl group having 1 to 6 carbon atoms, $R^3$ is a normal or branched alkyl group having 1 to 6 carbon atoms, $R^4$ is a hydrogen atom or methyl group, Q is an acid labile group, letters x, y, and z are numbers satisfying x+y+z=1, x and y are not equal to 0, and n is an integer of 1 to 3, with a photoacid generator which decomposes to generate an acid upon exposure to radiation.

* * * * *